US006461692B2

(12) United States Patent
Fujii et al.

(10) Patent No.: US 6,461,692 B2
(45) Date of Patent: *Oct. 8, 2002

(54) CHEMICAL VAPOR DEPOSITION METHOD AND CHEMICAL VAPOR DEPOSITION APPARATUS

(75) Inventors: Toshiaki Fujii, Kanagawa; Motoaki Adachi, Osaka; Kikuo Okuyama, Hiroshima-ken, all of (JP)

(73) Assignee: Ebara Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/117,285

(22) PCT Filed: Feb. 21, 1997

(86) PCT No.: PCT/JP97/00481
§ 371 (c)(1),
(2), (4) Date: Oct. 26, 1998

(87) PCT Pub. No.: WO97/31391

PCT Pub. Date: Aug. 28, 1997

(65) Prior Publication Data

US 2001/0032781 A1 Oct. 25, 2001

(30) Foreign Application Priority Data

Feb. 23, 1996 (JP) ................................. 8/60280
May 30, 1996 (JP) ................................ 8/157390

(51) Int. Cl.[7] .......................... C23C 16/48; C23C 14/28
(52) U.S. Cl. ........................................ 427/582; 427/595
(58) Field of Search ............................... 427/569, 570, 427/582, 595; 204/192.11

(56) References Cited

U.S. PATENT DOCUMENTS

| | | | | |
|---|---|---|---|---|
| 4,582,720 A | * | 4/1986 | Yamazaki | 427/572 |
| 4,664,769 A | | 5/1987 | Cuomo et al. | |
| 4,670,064 A | * | 6/1987 | Schachameyer et al. | 427/582 |
| 4,750,917 A | | 6/1988 | Fujii | |
| 4,985,227 A | * | 1/1991 | Ito et al. | 427/577 |
| 5,154,733 A | | 10/1992 | Fujii et al. | |
| 5,205,870 A | * | 4/1993 | Sato et al. | 427/582 |
| 5,304,407 A | * | 4/1994 | Hayashi et al. | 427/569 |
| 5,424,103 A | | 6/1995 | Ahn | |
| 5,541,003 A | * | 7/1996 | Nakayama et al. | 428/408 |
| 5,560,777 A | | 10/1996 | Ahn | |
| 5,660,693 A | * | 8/1997 | Abramson et al. | 204/192.12 |
| 5,705,826 A | * | 1/1998 | Aratani et al. | 257/40 |
| 5,753,320 A | * | 5/1998 | Mikoshiba et al. | 427/572 |
| 5,922,105 A | | 7/1999 | Fujii et al. | |

FOREIGN PATENT DOCUMENTS

| | | |
|---|---|---|
| DE | 3526830 C | 7/1986 |
| JP | 61-178050 | 8/1986 |
| JP | 61-220747 | 10/1986 |
| JP | 63-47141 | 9/1988 |
| JP | 2-115379 | 4/1990 |
| JP | 4-718 | 1/1992 |
| JP | 4-171061 | 6/1992 |
| JP | 6-66307 | 8/1994 |
| JP | 8-241864 | 9/1996 |

OTHER PUBLICATIONS

Schuegraf, Klaus, Handbook of Thin–Film Deposition Processes and Techniques. Noyes Publications, New Jersey, 1988, pp. 320 and 340.*
Adachi, Motoaki, "Film Formation by a New Chemical Vapor Deposition Process Using Ionization of Tetraethylorthosilicate". Jpn. J. Appl. Phys. vol. 34 (1995) pp. L1148–1150, Sep. 1995.*
Manabu Shimada, et al., J. Aerosol Sci., vol. 28, No. 4, pp. 649–661, Removal of Airborne Particles by a Tubular Particle–Removal Device Using UV/Photoelectron Method, 1997.
Manabu Shimada, et al., J. Aerosol Sci., vol. 30, No. 3, pp. 341–353, "Removal of Airborne Particles by a Device Using UV/Photoelectron Method Under Reduced Pressure Conditions", 1999.
Japanese Journal of Applied Physics, vol. 34, Part 2, No. 9A, pp. L1148–L1150 Sep. 1995.

* cited by examiner

*Primary Examiner*—Bret Chen
(74) *Attorney, Agent, or Firm*—Oblon, Spivak, McClelland, Maier & Neustadt, P.C.

(57) ABSTRACT

A method an apparatus for chemical vapor deposition for producing a thin film. The method includes the steps of: introducing a reactive gas into a reaction chamber wherein a substrate is supported in the reaction chamber; combining charged particles with a component of the reactive gas for ionizing the component; and electrostatically depositing the ionized component onto the substrate in an electric field. Charged particles may be photoelectrons or positive or negative ions produced by discharge. The reactive gas may be solely an ingredient gas containing a component for a thin film or a mixture of the ingredient gas and an oxidizing or reducing gas. The apparatus includes a reaction chamber including a support for a substrate, a device for introducing a reactive gas into the reaction chamber, an electric discharge device, and a device for forming an electric field in the reaction chamber in a direction to the support for the substrate, and an outlet for discharging the reactive gas.

5 Claims, 7 Drawing Sheets

CHEMICAL VAPOR DEPOSITION METHOD AND CHEMICAL VAPOR DEPOSITION APPARATUS

FIELD OF THE INVENTION

The present invention relates to a method for chemical vapor deposition and particularly relates to a method and an apparatus for producing a thin film by vapor deposition on a surface of a high technology product such as semiconductor, liquid crystal, precision instrument in a process for producing the product.

BACKGROUND OF THE INVENTION

In a process for producing a semiconductor, particles are generated in a step of producing a thin film onto a surface of a substrate by CVD. The particles refer to particulate materials which have non-uniform diameters, and which are made by interacting components for thin films with accompanying impurities in a reaction chamber of the CVD apparatus and aggregating the reactants. The particles are contaminants to the thin film and a main factor to reduce a yield of the product. Recently, as semiconductor circuits are becoming finer and finer, a size of particulates that may act as contaminants is getting smaller and smaller. Pattern sizes of 64M DRAM, 256M DRAM, 1G DRAM and 1T DRAM are about 0.35 µm, about 0.25 µm, about 0.18 µm, about 0.09 µm, and about 0.03 µm, respectively. It is considered that particulates having sizes not less than one tenth of the pattern size should be removed as contaminants. Highly reactive materials are frequently used as ingredient gases, and such materials are prone to generate particles. Therefore, a CVD apparatus is sometimes called "an apparatus for generating trash."

Conventionally, an amount of ingredient gases and temperatures are adjusted to decrease a rate of producing a thin film, thereby preventing particles from generating. However, the decreased rate of producing a thin film reduces an output of semiconductor products. Alternatively, since particles fall by gravitational force in the reaction chamber, a surface of the wafer which a thin film is formed onto may be arranged to face down. Alternatively, thermal migration or temperature fluctuations are generated in the reaction chamber so as to decrease an amount of particles accumulated onto a wafer. Although these processes are effective to decrease an amount of particles accumulated to a certain extent, these process may not produce a sufficient result.

A conventional CVD apparatus transfers a component for a thin film by molecular diffusion or thermal diffusion to a substrate and deposit thereon. However, the conventional CVD apparatus has a problem that a rate of producing a thin film is slow and that an amount of the deposition is small.

Figure 13:
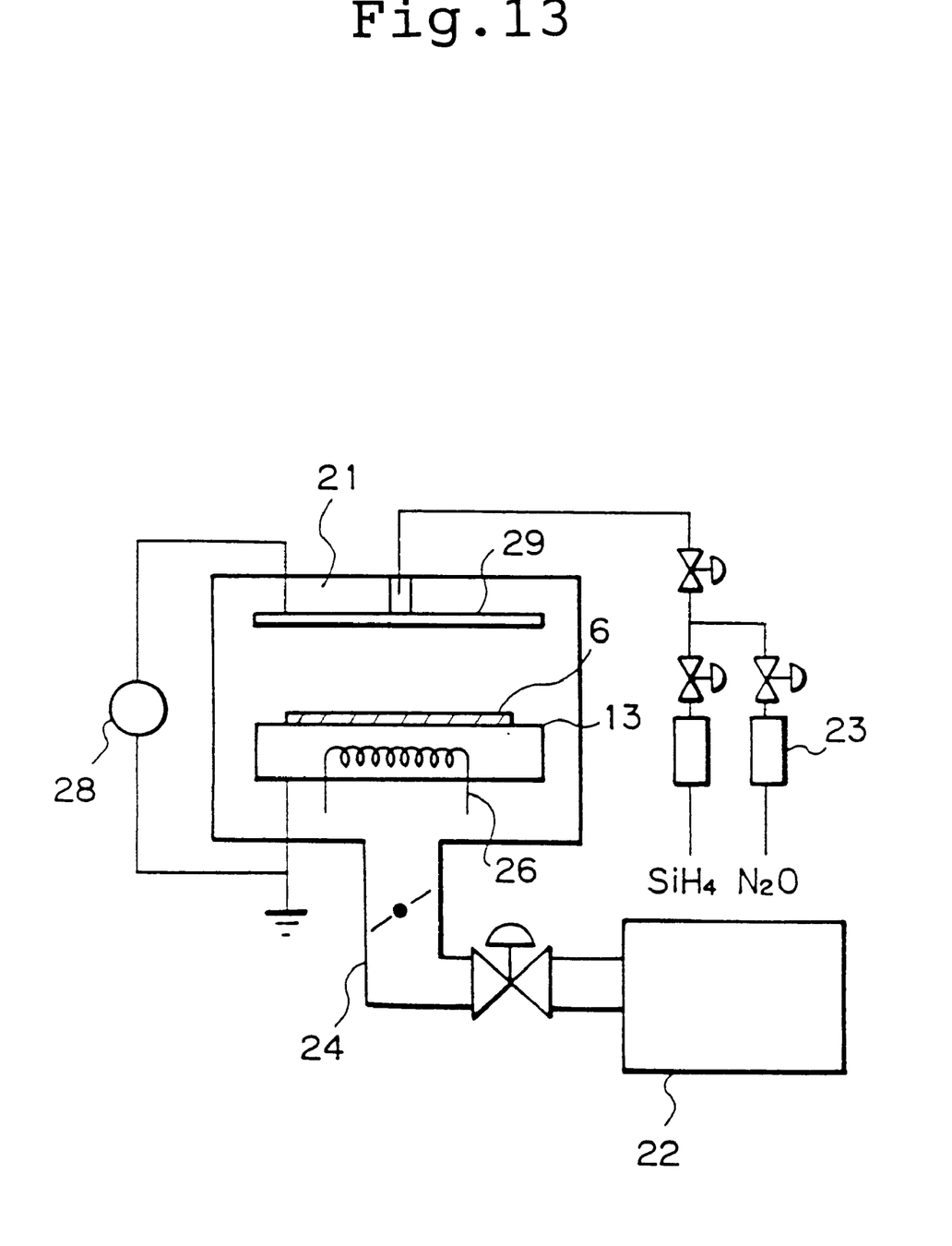
FIG. 13 is a schematic view showing a conventional CVD apparatus.

An example for generating particles is described in a vapor deposition step using a plasma CVD apparatus. FIG. 13 is a schematic view of a plasma CVD apparatus. The apparatus is used to produce an $SiO_2$ film onto a surface of a wafer 6 using an $SiH_4$ gas as reactants. A pressure in a reaction chamber 21 is reduced by a vacuum pump 22. Subsequently, reactive gases namely an $SiH_4$ gas serving as an ingredient gas and an $N_2O$ gas serving as an oxidative gas are mixed together by a mass flow controller 23, and then introduced into the reaction chamber 21. The pressure in reaction chamber 21 is kept constant by a pressure adjusting valve 24. The wafer 6 is heated by a heater 26, which is provided inside a support 13 for a wafer, to a constant temperature.

A high frequency voltage is applied to an upper electrode 29 and the support 13 for a wafer by an electric source 28 to generate plasma in a space therebetween so that $SiH_4$ radicals, $SiH_4^+$ ions, $N_2O$ radicals and $O_2^-$ ions are present in the space. When these radicals and ions reach to a surface of the wafer 6, upon receiving thermal energy, an $SiO_2$ film is formed.

These radicals and ions, however, have high activity and interact with reaction products and accompanying impurities to give particles. Thermal energy reaches to a sidewall of the reaction chamber by thermal radiation; and therefore an $SiO_2$ film is formed onto the sidewall also. Furthermore, $SiH_3^-$ ions, $SiH_2^{2+}$ ions, NO molecules and so on secondarily generate, and therefore there is a problem that quality of the film may not be uniform.

In view of the foregoing, it is an object of the present invention to provide a method and an apparatus for chemical vapor deposition which enable to produce a uniform film by preventing the generation of particles in the step of producing a thin film onto a surface of a substrate and which enable to form the thin film at a higher rate.

SUMMARY OF THE INVENTION

According to the present invention, there is provided a method for producing a thin film, which comprises the steps of: introducing a reactive gas into a reaction chamber wherein a substrate is supported in the reaction chamber; combining charged particles with a component of the reactive gas for ionizing the component; and electrostatically depositing the ionized component onto the substrate in an electric field. Preferably, the charged particles are photoelectrons or positive or negative ions produced by corona discharge, surface discharge or pulse discharge. Namely, in the present invention, ionization of a component constituting the reactive gas is conducted by using photoelectrons or ions, which may be referred to as charged particles. The reactive gas may be solely an ingredient gas containing a component for a thin film or a mixture of the ingredient gas and an oxidizing or reducing gas.

An apparatus for chemical vapor deposition, which carries out the aforementioned process, comprises: a reaction chamber including a support for a substrate; means for introducing a reactive gas containing a component for a thin film into the reaction chamber; means for discharging the reactive gas that passes through the reaction chamber; ionizing means for ionizing a component constituting the reactive gas; and means for forming an electric field in the reaction chamber so that the ionized component for a thin film is electrostatically deposited onto the substrate. Preferably, the ionizing means is means for producing photoelectrons or means for producing ions by electric discharge. Preferably, the ionizing means is provided in a passage for introducing the reactive gas into the reaction chamber.

PREFERRED EMBODIMENTS OF THE INVENTION

Preferred embodiments for carrying out the present invention are illustrated as follows.

Figure 1:
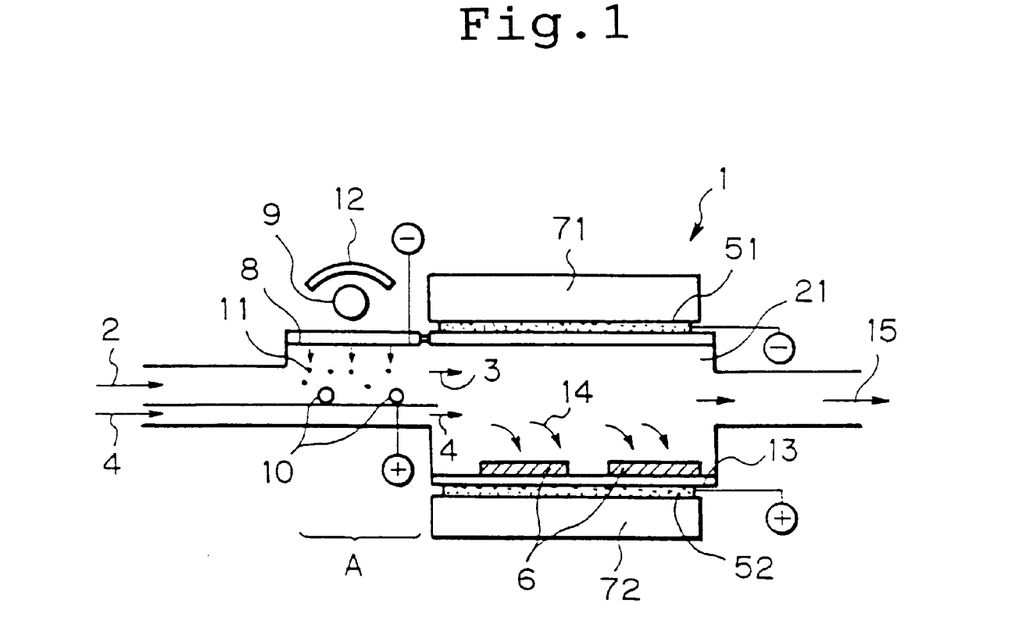
FIGS. 1 to 6 are schematic views showing CVD apparatuses having means for producing photoelectrons in accordance with the present invention.

FIG. 1 schematically shows an ambient-pressure CVD apparatus for forming an insulating film for an integrated circuit. The apparatus is used for forming an $SiO_2$ film onto a substrate using TEOS (tetraethylorothosilicate: $Si(OC_2H_5)_4$).

In FIG. 1, TEOS 2, which serves as a component for a thin film, along with He, which serves as a carrier gas, is introduced into an inlet of a CVD apparatus 1. A mechanism A for charging particles is provided in a passage. The mechanism A includes a photoelectron emitter 8, an ultraviolet lamp 9 and an electrode 10. An electric voltage is applied between the photoelectron emitter 8 and the electrode 10 to form an electric field in the passage. An ultraviolet ray from the ultraviolet lamp 9 is irradiated onto the photoelectron emitter 8 in the electric field to emit photoelectrons. Preferably, a reflection surface 12 is provided in a neighborhood of the ultraviolet lamp 9, thereby increasing an irradiation efficiency of the ultraviolet ray onto the photoelectron emitter. As a result, photoelectrons efficiently emit from the photoelectron emitter 8. Photoelectrons 11 are combined with TEOS molecules to produce TEOS ions 3. In an alternative process, photoelectrons may combine with electrophilic materials such as $O_2$ and $H_2O$ being present in the passage to produce negative ions, and the negative ions may combine with TEOS molecules to produce TEOS ions 3.

TEOS ions 3 intersect a flow of ozone 4, which is introduced from another inlet, in the reaction chamber 21. The TEOS ions 3 are oxidized by the ozone 4 to produce an oligomer or a gaseous intermediate of TEOS. The oligomer 14 has TEOS ions as nuclei and thus has electric charges. Electrodes 51, 52, which have plate like configurations, are disposed in an upper portion and a lower portion of the reaction chamber 21 to form an electric field in the reaction chamber, and a support 13 for a wafer and a wafer 6 are disposed on the positive electrode 52. Therefore, the oligomer 14 moves into a surface of the wafer 6 as shown by arrows, and electrostatically deposit onto the surface thereof.

Subsequently, the oligomer is further oxidized by the ozone at the surface of the wafer to form an $SiO_2$ film.

Numerals 71 and 72 refer to kilns for accelerating a reaction of TEOS with ozone in the reaction chamber. After contributing to the reaction the TEOS and ozone are discharged to an outside of the apparatus 1 as shown by arrow 15.

Not the component for a thin film (TEOS in this case) but the ozone may be introduced into the passage where the photoelectron emitter 8 is provided (the upper passage in FIG. 1), and the component for a thin film may be introduced into a passage where the photoelectron emitter 8 is not provided (the lower passage in FIG. 1). In this case; photoelectrons 11 are combined with the ozone to produce ozone ions. The ozone ions intersect a flow of TEOS in the reaction chamber 21. The TEOS is not only oxidized but also ionized by the ozone ions to produce an oligomer 14 of TEOS. The oligomer 14 is electrostatically deposited onto the surface of the wafer.

A method for ionizing particulates by photoelectrons has been proposed by the present inventors in JP-B-3-5859, JP-B-7-93098, JP-A-2-303557, JP-A-3-108698 and JP-A-4-243540, all of which are incorporated herein as references, and the method may be applied to the step of ionizing the component of the reactive gas by photoelectrons in accordance with the present invention.

Any material that emits photoelectrons upon irradiation of an ultraviolet ray may be used as a photoelectron emitter 8. However, a material having a small photoelectronical work function is preferable. In view of effect and economy, the material for the photoelectron emitter may include one of the elements of Ba, Sr, Ca, Y, Gd, La, Ce, Nd, Th, Pr, Be, Zr, Fe, Ni, Zn, Cu, Ag, Pt, Cd, Pb, Al, C, Mg, Au, In, Bi, Nb, Si, Ti, Ta, U, B, Eu, Sn, P, and W; a compound or an alloy of these elements; or a mixture of the elements, the compound and/or the alloy. The material may consist essentially one of the species or a combination of at least two species.

A compound in use for the photoelectron emitter 8 includes oxides, borides, and carbides. The oxides include BaO, SrO, CaO, $Y_2O_5$, $Gd_2O_3$, $Nd_2O_3$, $ThO_2$, $ZrO_2$, $Fe_2O_3$, ZnO; CuO, $Ag_2O$, $La_2O_3$, PtO, PbO, $Al_2O_3$, MgO, $In_2O_3$, BiO, NbO, BeO and so on. The borides include $YB_6$, $GdB_6$, $LaB_5$, $NdB_6$, $CeB_6$, $EuB_6$, $PrB_6$, $ZrB_2$, and so on. The carbides include UC, ZrC, TaC, TiC, NbC, WC and so on.

Oxides may be obtained by a process for heating only surfaces of a metal in air or a process for oxidizing the metal by a chemical. The metal may be heated prior to its use, thereby producing an oxide layer in a surface, which is stable over a long period of time. For example, an Ag—Mg alloy may be exposed to steam at 300 to 400° C. to produce an oxide film onto its surface, and the oxide film is stable over a long period of time.

An alloy, which may be used as the photoelectron emitter 8, includes brass, bronze, phosphorus bronze, an Ag—Mg alloy (Mg: 2 to 20 percent by weight), a Cu—Be alloy (Be: 1 to 10 percent by weight), a Ba—Al alloy and so on. The Ag—Mg alloy, the Cu—Be alloy and the Ba—Al alloy are specially preferred among these.

As the present inventor has proposed in JP-A-3-108698, a multiple layered structure having a plurality of photoelectron emitters may be used.

A material being capable of emitting photoelectrons may be provided onto a suitable substrate to produce a photoelectron emitter. For example, a thin film of Au may be provided onto a substrate of quartz glass that transmits an ultraviolet ray (JP-B-7-93098). In this case, an electrically conductive material may be further provided (JP-A-5-68875). The photoelectron emitter 8 in FIG. 1 has a glass and a thin film of Au is coated thereon.

Preferably, the photoelectron emitter 8 has configurations having a large area for ultraviolet radiation. For example, the configurations include bar-like, cotton-like, grid-like, plate-like, pleat-like, curved-surface-like, cylinder-like, mire-netting-like configurations and so on.

The photoelectron emitter in a thin film may be coated onto a surface of an ultraviolet source, such as an ultraviolet lamp to integrate thereof (JP-A-4-24354). Alternatively, the photoelectron emitter may be disposed in a neighborhood of the ultraviolet lamp.

An irradiating ray for emitting photoelectrons from the photoelectron emitter includes an ultraviolet ray, an electromagnetic wave, a laser, a radiation and so on. In view of operatability and effect, an ultraviolet ray is preferred. A source for an ultraviolet ray includes a mercury lamp, a hydrogen-discharge tube, a Xenon-discharge lamp, a Lyman-discharge tube, and so on.

The electrode 10 is used to irradiate an ultraviolet ray onto the photoelectron emitter in an electric field. Any electrically conductive material may be used as the electrode, and any electrode material for known apparatuses for charging particles may be used. The electrode in FIG. 1 has a bar configuration. However, the electrode may have plate like configurations or mire netting like configurations. Preferably, a voltage for the electric field is adjusted to 0.1 V/cm to 2 kV/cm.

Other electrodes 51, 52 are used to move an oligomer of TEOS, which is ionized by photoelectrons and then oxidized by ozone, to a wafer in an electric field, and to electrostatically deposit the oligomer thereon. The wafer is disposed between a pair of the electrodes 51, 52, and applying a voltage between the electrodes forms an electric field. Preferably, a voltage for the electric field is adjusted to 10 V/cm to 2 kV/cm. Any electrically conductive material may be used as the electrode, and any electrode material for known apparatuses for charging particles may be used. The electrode may have plate-like configurations, bar-like configurations, mire-netting-like configurations, and so on.

Figure 2:
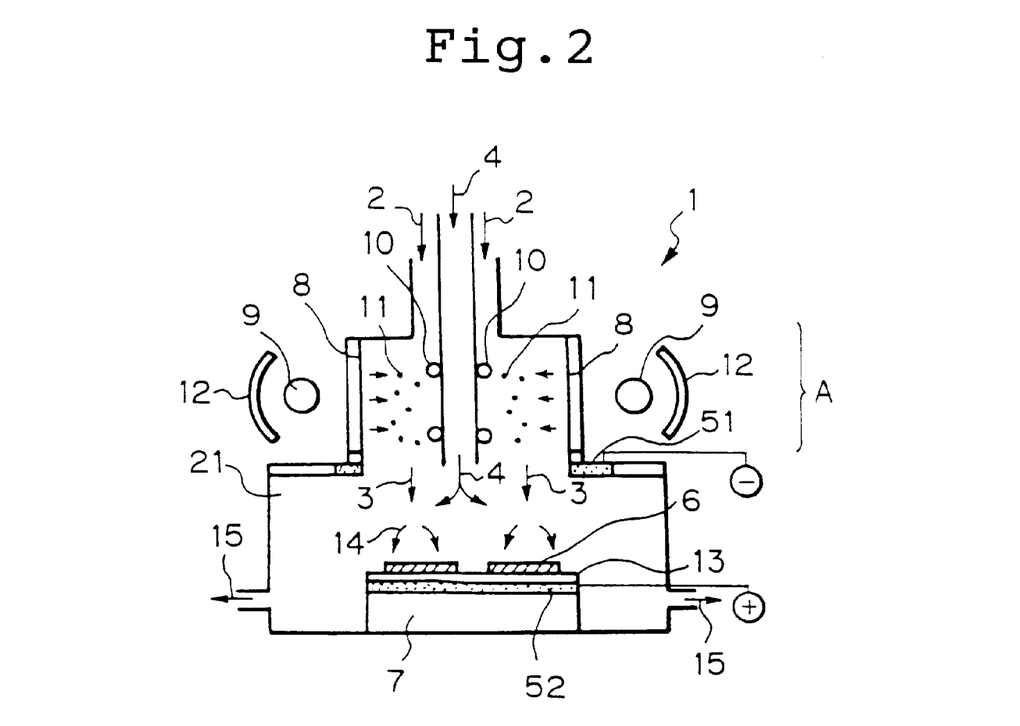

FIG. 2 shows another embodiment of a CVD apparatus in accordance with the present invention. Ozone 4, which serves as an oxidizing gas, is introduced into the apparatus through a central passage for introducing a gas. TEOS 2, which serves as a component for a thin film, along with He, which serves as a carrier gas, is introduced into the apparatus through another passage annularly surrounding the central passage. TEOS 2 is combined with photoelectrons 11 to ionize thereof, and then the ionized TEOS ions 3 are mixed with ozone 4 to oxidize thereof, thereby producing an oligomer 14 of TEOS. An electric field moves the oligomer 14 to a wafer 6, thereby electrostatically depositing the oligomer thereon. The electric field is formed by applying a voltage between a positive electrode 52, which is disposed under the wafer, and a negative electrode 51, which is disposed in an upper portion of the reaction chamber 21. The oligomer 14 is further oxidized on a surface of the wafer 6 to form an $SiO_2$ film. Numeral 7 refers to a kiln, and other numerals refer to the same elements as shown in FIG. 1.

Figure 3:
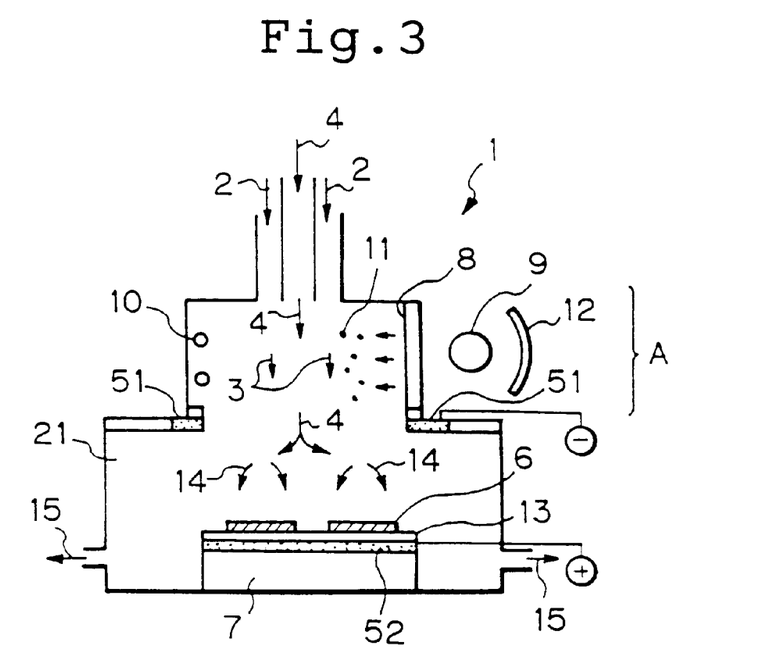

FIG. 3 shows another embodiment of a CVD apparatus in accordance with the present invention. Ozone 4 is introduced into the apparatus through a central passage for introducing a gas, and TEOS 2 is introduced into the apparatus through a passage annularly surrounding the central passage. TEOS 2 is combined with photoelectrons 11 to ionize thereof, and, simultaneously oxidized to produce an oligomer 14 of TEOS. In this case, oxidation by the ozone may take place prior to ionization of TEOS. Alternatively, ozone 4 may be combined with photoelectrons 11 to produce ozone ions, and then the ozone ions may oxidize the TEOS.

Figure 4:
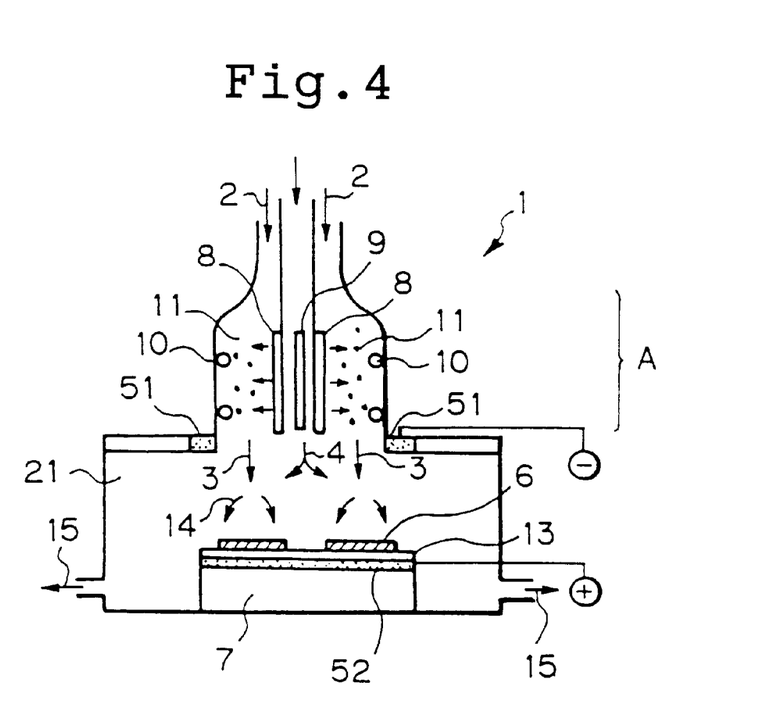

FIG. 4 shows another embodiment of a CVD apparatus in accordance with the present invention. In FIG. 4, a low-pressure mercury lamp 9 simultaneously emits an ultraviolet ray of 184 nm, the wavelength of which produces ozone, and an ultraviolet ray of 254 nm, the wavelength of which produces photoelectrons. A photoelectron emitter 8 has a filter having a cylindrical configuration and cutting an ultraviolet ray with a short wavelength; and Au coated onto an outer surface of the filter. The filter cuts the ultraviolet ray of 184 nm, which is harmful to stabilize characteristics of emitting photoelectrons by Au over a long period of time, and therefore, only the ultraviolet ray of 254 nm is irradiated onto Au. Oxygen is introduced into the apparatus through a central passage for introducing a gas. When the oxygen passes around the lamp 9, the oxygen adsorbs the ultraviolet ray of 184 nm to produce ozone 4. On the other hand, TEOS 2 is introduced into the apparatus through a passage annularly surrounding the central passage. Upon irradiating the ultraviolet ray of 254 nm from the lamp to the photoelectron emitter 8, photoelectrons emit from Au, and the photoelectrons combine with TEOS 2 to produce TEOS ions 3. Subsequently, the TEOS ions 3 are mixed with ozone 4 to oxidize, thereby producing an oligomer of TEOS. The oligomer 14 is electrostatically deposit onto a wafer 6, and then further oxidized to form an $SiO_2$ film.

Figure 5:
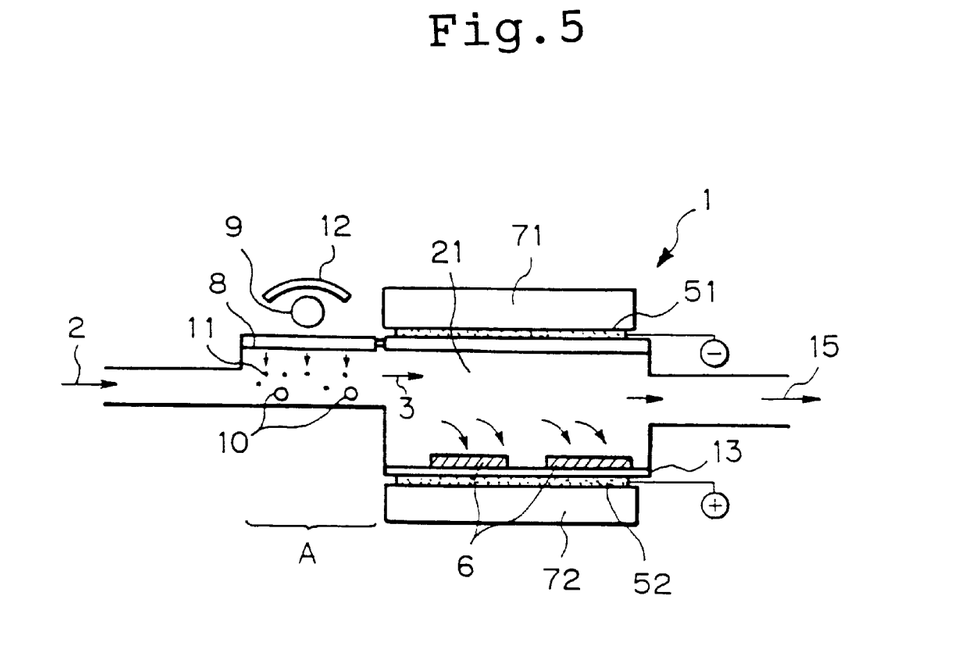

FIG. 5 shows another embodiment of a CVD apparatus in accordance with the present invention, and this apparatus allows an epitaxial growth of an $SiO_2$ film on a wafer 6. In FIG. 5, $SiH_4$ serving as a component for a thin film along with He serving as a carrier gas is introduced into an apparatus. Photoelectrons 11 produced in the passage are combined with $SiH_4$ to ionize $SiH_4$, thereby producing ions 3. Subsequently, ions 3 move to the wafer 6 in an electric field and electrostatically deposit onto the wafer 6. An $SiO_2$ film is produced by epitaxial growth on a surface of the wafer 6. In this case, a pressure and a temperature in the apparatus are maintained at 200 Torr and 1200° C., respectively.

Figure 6:
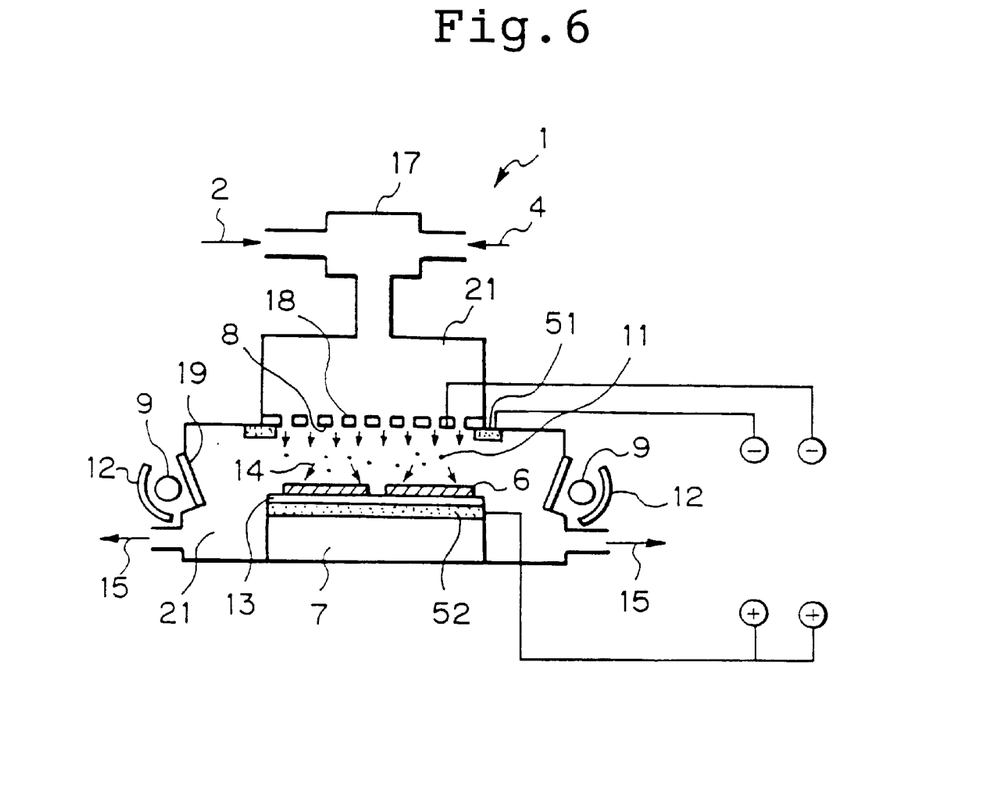

FIG. 6 shows another embodiment of a CVD apparatus in accordance with the present invention, and this apparatus enables forming an insulating film (highly dielectric-film) on a wafer 6. A component 2 for a thin film is a mixture gas of 3 parts of $Ba(DPM)_2$, 3 parts of $Sr(DPM)_2$, and 4 parts of $Ti(i-OC_3H_7)_4$. Oxygen serving as an oxidizing gas 4 is used, and these gases are mixed together in a mixture chamber 17. It is important to uniformly mix the ingredient component 2 with the oxidizing gas. Particularly, the mixture gas becomes a viscous flow in a pressure of 0.01 to scores of Torr at the reaction chamber 21, and it is necessary to form a gas flow of uniform concentrations and velocities. A shower head 18 having a thin plate perforated with a plurality of apertures is provided for accelerating a uniform mixture and forming a uniform gas flow toward the wafer 6. A photoelectron emitter (Au) 8 is deposited onto a lower surface of the shower head 18 or a surface opposing to the wafer 6. An ultraviolet lamp 9 is provided around the reaction chamber 21, and an ultraviolet ray is irradiated onto the Au film through a quartz plate 19. A positive electrode 52 is disposed between a support 13 for a wafer and a heater (kiln) 7, and a negative electrode is disposed at the Au film 8 in the shower head 18, which opposes the wafer 6. An appropriate voltage for emitting photoelectrons 11 is applied to the electrodes. Around a bottom surface of the shower head 18, which opposes to the wafer 6, is disposed another negative electrode 51. An appropriate electric field for moving ions produced by ionization of the ingredient gas into the wafer and deposit thereonto is formed by electrodes 51, 52.

In the apparatus of FIG. 6, the ingredient gas 2 is mixed with the oxidizing gas 4 in the mixing chamber 17 to oxidize the ingredient gas, and the mixture is further uniformly mixed in the shower head 18 to further oxidize the ingredient gas. The reacted gas with a uniform flow rate is supplied to the wafer 6. Simultaneously, an ultraviolet ray from the ultraviolet lamp 9 irradiates the Au film, thereby emitting photoelectrons. Photoelectrons 11 move toward electrode 52 and combine with the reacted gas to ionize thereof. The ionized reacted gas deposits onto the wafer 6. The shower head 18 keeps a uniform flow rate distribution in the flow of the ionized reacted gas and keeps the same direction in the overall flow so that the component for a thin film efficiently deposits onto the wafer.

Figure 7:
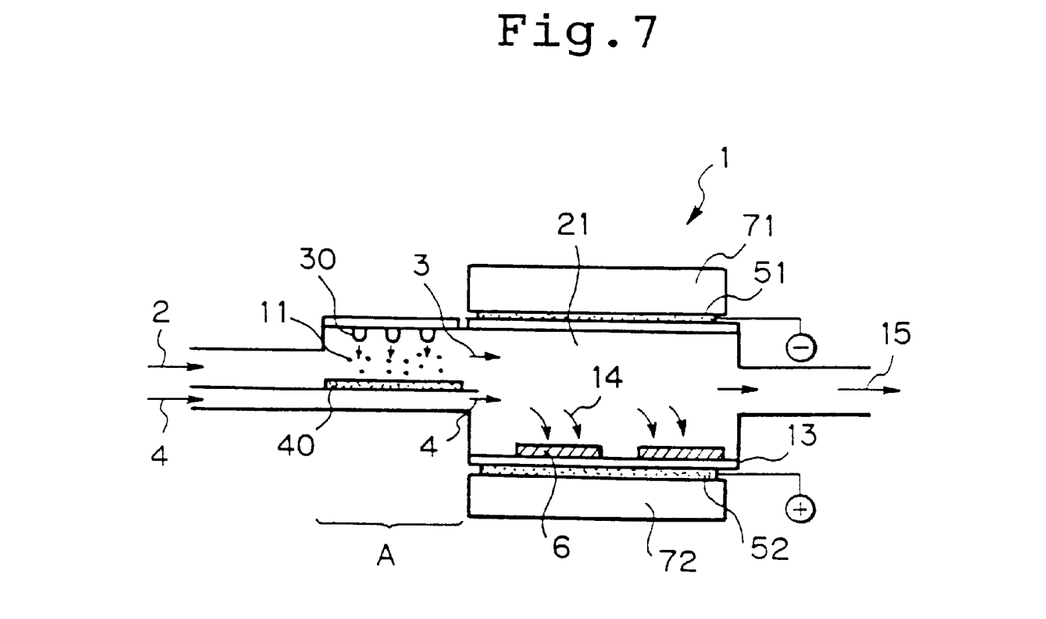
FIGS. 7 to 10 are schematic views showing CVD apparatuses having means for producing ions by corona discharge in accordance with the present invention.

FIG. 7 shows another embodiment of an CVD apparatus in accordance with the present invention. In FIG. 7, TEOS 2 serving as a component for a thin film along with He serving as a carrier gas is introduced into an inlet of the CVD apparatus 1. A mechanism A for charging particles is provided in the passage. The mechanism A includes a discharge electrode 30 having a needle configuration and an opposing electrode 40. A negative corona voltage is applied to the discharge electrode 30 to produce corona discharge, thereby forming an electric field between the electrodes. Numerous negative ions and electrodes 11 are formed around the electrode 30, and a shower of the negative ions and electrons toward the opposing electrode 40, which serves as a positive electrode, is formed. These negative ions and electrons combine with TEOS molecules to produce TEOS ions 3.

TEOS ions 3 intersect a flow of ozone 4, which is introduced from another inlet, in the reaction chamber 21. The TEOS ions 3 are oxidized by the ozone 4 to produce an oligomer or a gaseous intermediate of TEOS. The oligomer 14 has TEOS ions as nuclei and thus has electric charges. Electrodes 51, 52, which have plate like configurations, are disposed in an upper portion and a lower portion of the reaction chamber 21 to form an electric field in the reaction chamber, and a support 13 for a wafer and a wafer 6 are disposed on the positive electrode 52. Therefore, the oligomer 14 moves into a surface of the wafer 6 as shown by arrows, and electrostatically deposit onto the surface thereof.

Subsequently, the oligomer is further oxidized by the ozone at the surface of the wafer to form an $SiO_2$ film.

Numerals 71 and 72 refer to kilns for accelerating a reaction of TEOS with ozone in the reaction chamber. After contributing to the reaction the TEOS and ozone are discharged to an outside of the apparatus 1 as shown by arrow 15.

Ions for ionizing components for a thin film may be positive ions. In this case, a positive voltage is applied onto the discharge electrode 30. An amount of positive ions thus produced is larger than an amount of negative ions, and this is effective for ionization. However, in general, negative ions have larger degree of mobility than positive ions, and this is effective for ionization. In view of the foregoing, generally, to produce negative ions is preferable. The corona discharge applied by negative voltage tends to produce ozone. Therefore, to apply the negative voltage is preferable when the component for a thin film is reacted with ozone. When the ozone is preferably absent, a positive voltage may be applied. To select positive ions or negative ions as ions to produce depends on types of substances to be ionized.

When negative ions are produced to charge the component for a thin film with negative charges, positive voltage is applied to collecting electrode 52. On the other hand, when positive ions are produced, negative voltage is applied to collecting electrode 52.

In FIG. 7, the discharge electrode 30 has needle like configurations, and the opposing electrode 40 has plate like configurations. However, these may have grid like, linear like, sphere like, corrugated, pleated, or comb-like configurations. In general, an applied voltage for producing the corona discharge ranges from 1 to 80 kV.

Figure 8:
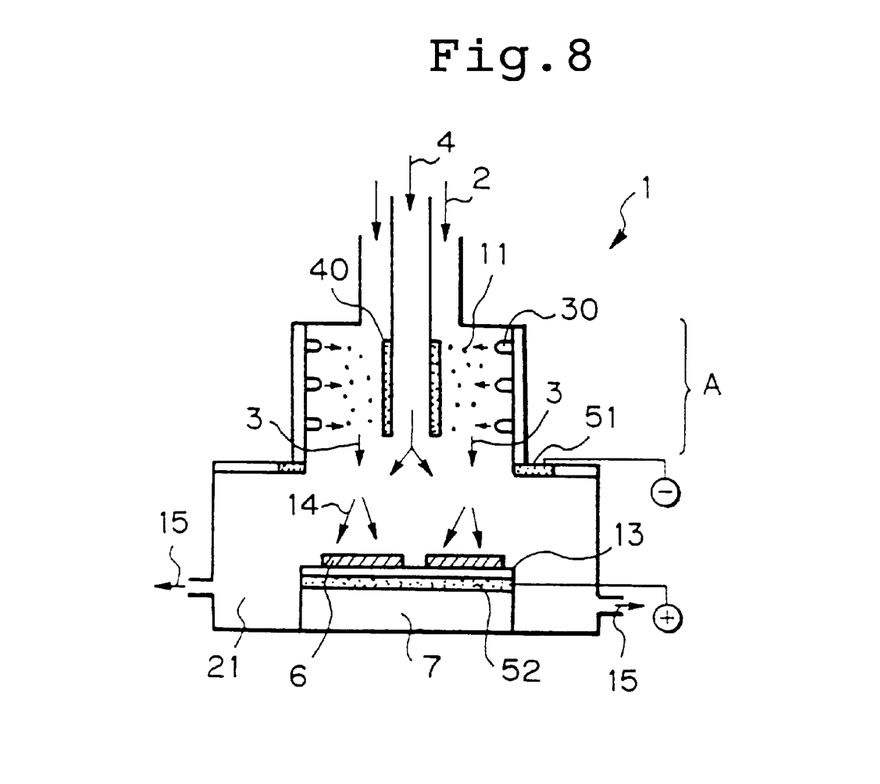

FIG. 8 shows another embodiment of an CVD apparatus in accordance with the present invention. Ozone 4, which serves as an oxidizing gas, is introduced into the apparatus through a central passage. TEOS 2 serving as a component for a thin film along with He serving as a carrier gas is introduced into the CVD apparatus through another passage annularly surrounding the central passage. TEOS 2 are combined with ions 11 to ionize thereof, and the ionized TEOS ions 3 are mixed with ozone 4 to produce an oligomer 14 of TEOS.

Figure 9:
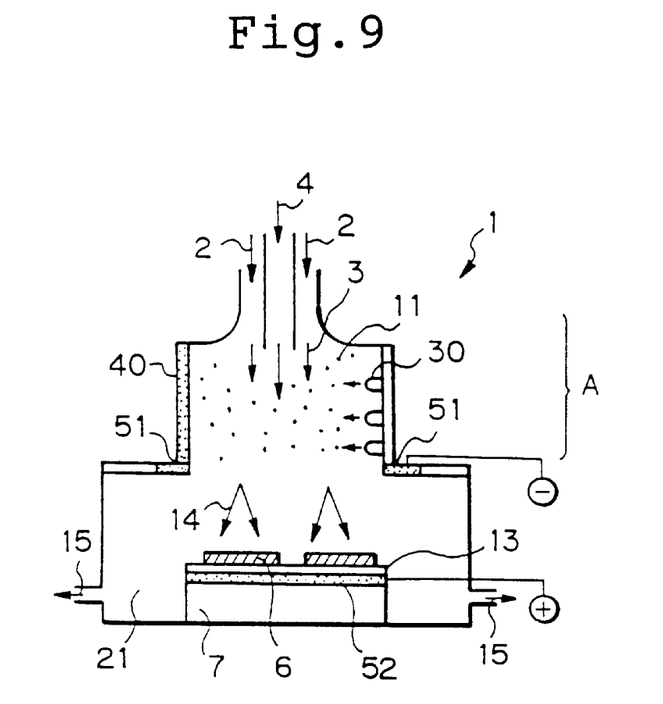

FIG. 9 shows another embodiment of an CVD apparatus in accordance with the present invention. Ozone 4 is introduced into the apparatus through a central passage. TEOS 2 is introduced into the CVD apparatus through another passage annularly surrounding the central passage. TEOS 2 is combined with ions 11 to produce TEOS ions 3 while oxidation by ozone proceeds, thereby producing an oligomer 14 of TEOS. In this case, the oxidation by ozone may precede the ionization by TEOS. Alternatively, ozone 4 may be combined with ions 11 to produce ozone ions, and subsequently, the ozone ions may oxidize TEOS.

Figure 10:
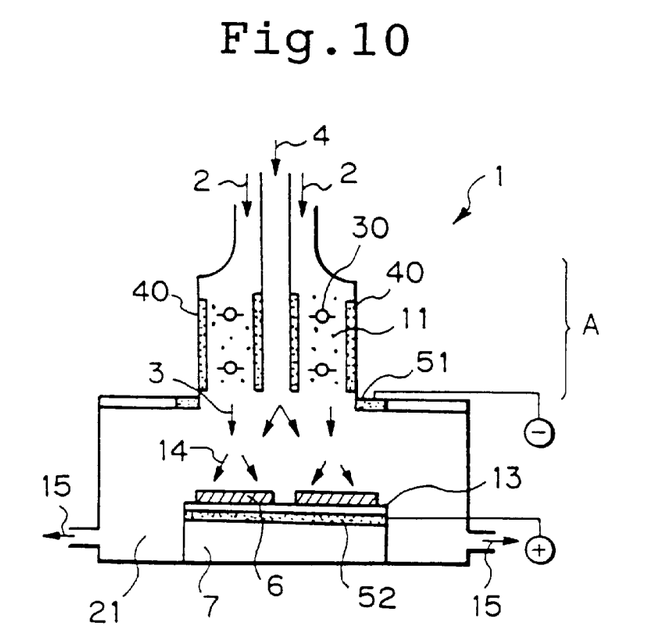

FIG. 10 shows another embodiment of an CVD apparatus in accordance with the present invention. Ozone 4 is introduced into the apparatus through a central passage. TEOS 2 is introduced into the CVD apparatus through another passage annularly surrounding the central passage. TEOS 2 is combined with ions 11 to produce TEOS ions, and subsequently, the TEOS ions 3 thus ionized are mixed with ozone 4 to oxidize, thereby producing an oligomer 4 of TEOS.

In apparatuses of FIGS. 7 to 10, instead of introducing the component for a thin film (in this case, TEOS) into passages where the discharge electrode 30 is disposed (the upper passage in FIG. 7 and the outer, annular passages in FIGS. 8 to 10), ozone may be introduced into the passages, and the component for a thin film may be introduced into the other passage where the discharge electrode is absent (the lower passage in FIG. 7 and the central passages in FIGS. 8 to 10). In this case, the ozone is combined with ions 11 to produce ozone ions. The ozone ions are mixed with a flow of TEOS in the reaction chamber 21. At this time, TEOS is oxidized and ionized by the ozone ions to produce an oligomer 14 of TEOS. The oligomer 14 is electrostatically deposit onto a surface of the wafer.

In addition to ionize the ingredient component by ions produced by photoelectrons and electric discharge, ionization by radiation such as an alpha ray and a beta ray is possible, and the scope of the present invention includes such ionization. However, it is difficult to operate the radiation, and may be practically limited. To conduct electric discharge, in addition to the corona discharge, glow discharge, arc discharge, spark discharge, surface discharge, pulse discharge, high frequency discharge, laser discharge, trigger discharge, plasma discharge and so on may be adopted. In view of convenience, operatability and effect, the corona discharge is preferable among these. Surface discharge and pulse discharge provide increased ion concentrations and allows to make the apparatus smaller, and therefore they are preferable.

The aforementioned embodiments use TEOS and $SiH_4$ as components for a thin film. However, the method in accordance with the present invention may apply to the other components for a thin film. Ingredient components are illustrated as follows. Ingredient components for producing a semiconductor thin film includes $SiH_4$, $Si_2H_6$, $SiH_2Cl_2$, $SiH_{4-x}Cl_x$ (wherein x is 0, 2, 3 or 4), $SiCl_4$, $SiHCl_3$. Ingredient components for producing a metallic film includes $WF_6$, a mixture of $WF_6$ and $SiH_4$, a mixture of $WF_6$ and $SiH_2Cl_2$, $Cr(C_2H_3CH(CH_3)_2)$, a mixture of $WF_4$ and $GeH_4$, $Al(C_4H_9)_3$, $(C_2H_5)_2Ru$, and $(C_5H_7O_2)_3Ir$. Ingredient components for producing an insulating thin film includes $SiH_4$, $SiH_2Cl_2$, $Si(OC_2H_5)_4$, $Si(CH_3O)_4$, $[(CH_3)_2SiO-]_4$, which is referred to as OMCTS, a mixture of $SiH_4$ and $PH_3$, a mixture of $Si(OC_2H_5)_4$ and $PO(OCH_3)_3$, a mixture of $SiH_4$ and $B_2H_6$, $Ba(DPM)_2$, $Sr(DPM)_2$, $Ti(i-OC_3H_7)_4$, $Pb(DPM)_2$, $Zr(DPM)_4$, $TiO(DPM)_2$, $Bi(C_6H_5)_3$, $Ta(O-n-C_5H_{11})_5$. A type of a reactive gas, which is introduced into the reaction chamber along with these ingredient components, and a temperature in the reaction chamber and so on are appropriately selected to adjust a composition and characteristics of the thin film to be produced.

Examples of the present invention is described as follows. However, the present invention is not limited by Examples.

EXAMPLES

Example 1

Using an ambient-pressure CVD apparatus as shown in FIG. 2, TEOS serving as a component for a thin film is used to produce an $SiO_2$ film onto a wafer in following conditions. At the same time, a rate of producing the film depending on an applied voltage between the electrode 51 and the electrode 52 in the reaction chamber is determined. The applied voltage is a voltage for forming an electric field.

volume of the apparatus: about 5 liter;
supply amount of a mixture of TEOS and He(carrier gas): 400 ml per minute;
TEOS concentration: $1.0 \times 10^{-5}$ mol per liter;
supply amount of a mixture of ozone and oxygen (carrier gas): 600 ml per minute;
ozone concentration: $1.5 \times 10^{-4}$ mol per liter;
temperature of kiln: 300° C.;
electrode material for producing a thin film or for electrostatic deposition: SUS in grid like configurations;
applied voltage for producing a thin film: 0 to 5 kV;
photoelectron emitter: Au coated onto quartz glass;
ultraviolet lamp: mercury lamp (254 nm);
electrode material for emitting photoelectrons: Au plated onto SUS;
electric field for emitting photoelectrons: 150 V per cm;
diameter of a wafer: 5 inch;
method for determining a rate of producing a thin film: film thickness determined by ellipsometer and time for producing a thin film; and
method for determining a composition of a thin film: FT-IR;

Result

Figure 11:
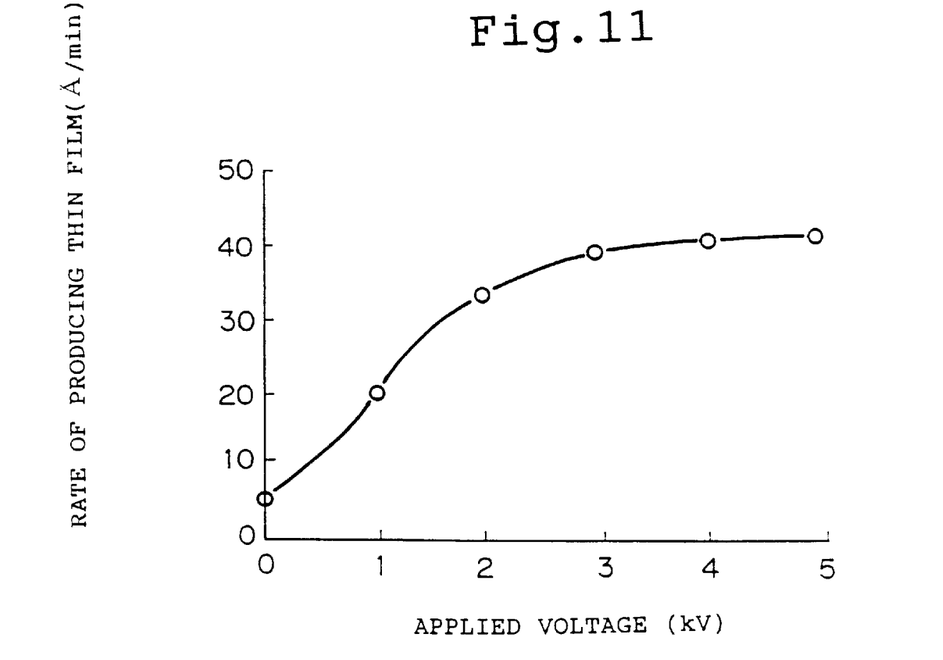
FIG. 11 is a graph showing results of determining a rate of producing a thin film in accordance with applied voltages using the apparatus of FIG. 2.

FIG. 11 shows correlation between applied voltage of electrodes for producing a thin film and a rate of producing a thin film. As the voltage increases, the rate of producing a thin film increases. The result confirms that ionization of TEOS forms the thin film.

Thin films produced where applied voltages are 1 kV, 2 kV and 5 kV, are analyzed by FT-IR for structures thereof, and none of the films contain a compound having an ethoxy radical or a hydroxy radical, and the films are high quality free of impurities. Topology of the thin films are observed by SEM, surfaces are planar.

Example 2

Using an ambient-pressure CVD apparatus as shown in FIG. 2, an $SiO_2$ film is produced onto a wafer with TEOS serving as a component for a thin film in following conditions. At the same time, a rate of producing the film depending on an applied voltage between the electrode 51 and the electrode 52 in the reaction chamber is determined. The applied voltage is a voltage for forming an electric field.

The experiment was conducted in the same conditions as Example 1 except that, instead of the photoelectron emitter in Example 1, the discharge electrode having needle like configurations and the opposing electrode having plate like configurations were used to produce negative ions and that corona voltage was applied to the discharge electrode to form an electric field of 2.5 kV per centimeter between the electrodes.

Result

Figure 12:
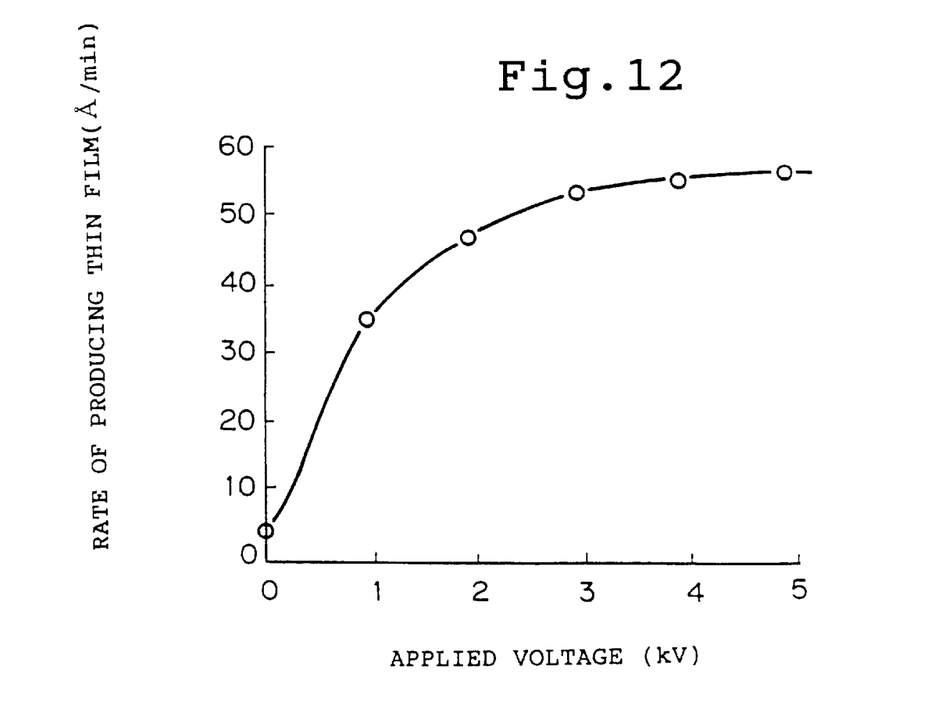
FIG. 12 is a graph showing results of determining a rate of producing a thin film in accordance with applied voltages using the apparatus of FIG. 10.

FIG. 12 shows correlation between applied voltage of electrodes for producing a thin film and a rate of producing a thin film. As the voltage increases, the rate of producing a thin film increases. The result confirms that ionization of TEOS forms the thin film.

Results of analyzing the thin films by FT-IR for structures thereof and results of observing the thin films by SEM are the same as those of FIG. 1, confirming that the films are high quality.

What is claimed is:

1. A method for forming a thin film, comprising:

introducing a reactive has including an ingredient gas into a reaction chamber, wherein a substrate is supported in the reaction chamber;

generating photoelectrons by interaction of UV photons with a photoelectric emitter;

ionizing the ingredient gas by the generated photoelectrons to produce ionized ingredient gas species;

moving the ionized ingredient gas species by an electric field in a direction of the substrate; and chemically depositing the ionized ingredient gas species onto the substrate.

2. A method of claim 1 wherein the reactive gas further comprises an oxidizing gas.

3. A method of claim 2 wherein, prior to the introducing step, the ingredient gas is mixed with the oxidizing gas.

4. A method of claim 1 wherein, subsequent to the ionizing step, an oxidizing gas is introduced into the reaction chamber for oxidizing the ionized ingredient gas.

5. A method of claim 1 wherein a pressure in the reaction chamber is at least 200 torr during at least one of the ionizing step, the moving step and the chemically depositing step.

\* \* \* \* \*